United States Patent

Harumoto et al.

(10) Patent No.: US 10,539,877 B2
(45) Date of Patent: Jan. 21, 2020

(54) DEVELOPING METHOD

(71) Applicant: SCREEN Holdings Co., Ltd., Kyoto (JP)

(72) Inventors: Masahiko Harumoto, Kyoto (JP); Koji Kaneyama, Kyoto (JP); Masaya Asai, Kyoto (JP); Yuji Tanaka, Kyoto (JP); Chisayo Nakayama, Kyoto (JP); You Arisawa, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/287,292

(22) Filed: Feb. 27, 2019

(65) Prior Publication Data

US 2019/0294049 A1  Sep. 26, 2019

(30) Foreign Application Priority Data

Mar. 23, 2018  (JP) ................................ 2018-056647

(51) Int. Cl.
*G03D 3/00* (2006.01)
*G03F 7/30* (2006.01)
*H01L 21/67* (2006.01)
*G03F 7/32* (2006.01)

(52) U.S. Cl.
CPC .............. *G03F 7/3021* (2013.01); *G03F 7/32* (2013.01); *H01L 21/6715* (2013.01)

(58) Field of Classification Search
USPC ................................................. 396/564, 611
See application file for complete search history.

(56) References Cited

U.S. PATENT DOCUMENTS

| | | | | |
|---|---|---|---|---|
| 2005/0063699 | A1* | 3/2005 | Lin | G03D 5/00 396/611 |
| 2006/0048792 | A1* | 3/2006 | Nakamura | B08B 3/02 134/2 |
| 2009/0035021 | A1* | 2/2009 | Yamamoto | G03F 7/3021 399/222 |
| 2009/0130614 | A1* | 5/2009 | Ookouchi | G03F 7/3021 430/434 |
| 2010/0203250 | A1* | 8/2010 | Sato | G03F 7/3028 427/402 |
| 2010/0233637 | A1* | 9/2010 | Arima | G03F 7/3021 430/325 |
| 2016/0096203 | A1* | 4/2016 | Kai | H01L 21/6708 134/30 |
| 2016/0195811 | A1 | 7/2016 | Tanaka et al. | |

FOREIGN PATENT DOCUMENTS

JP  2016-127204 A  7/2016

* cited by examiner

*Primary Examiner* — Rodney E Fuller
(74) *Attorney, Agent, or Firm* — Ostrolenk Faber LLP

(57) ABSTRACT

After a developing step is performed by feeding developer to the substrate, a second nozzle starts dispensation of a surfactant rinse liquid to a position away from the center of a rotating substrate. This operation is performed such that the center of the substrate does not enter into a reaching region of the substrate where the surfactant rinse liquid dispensed from the second nozzle firstly reaches. Accordingly, a point of the reaching region of the surfactant rinse liquid is dispersed, leading to suppression in locally smaller or larger line width of a resist pattern at the center and around the center of the substrate. Consequently, this achieves enhanced uniformity of the line widths of the resist pattern within a surface of the substrate during the rinse process.

7 Claims, 12 Drawing Sheets

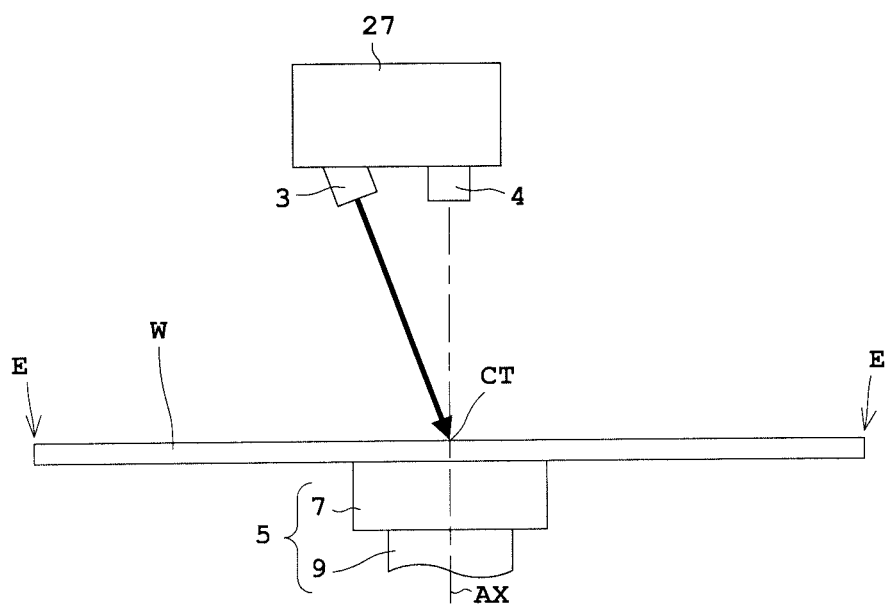
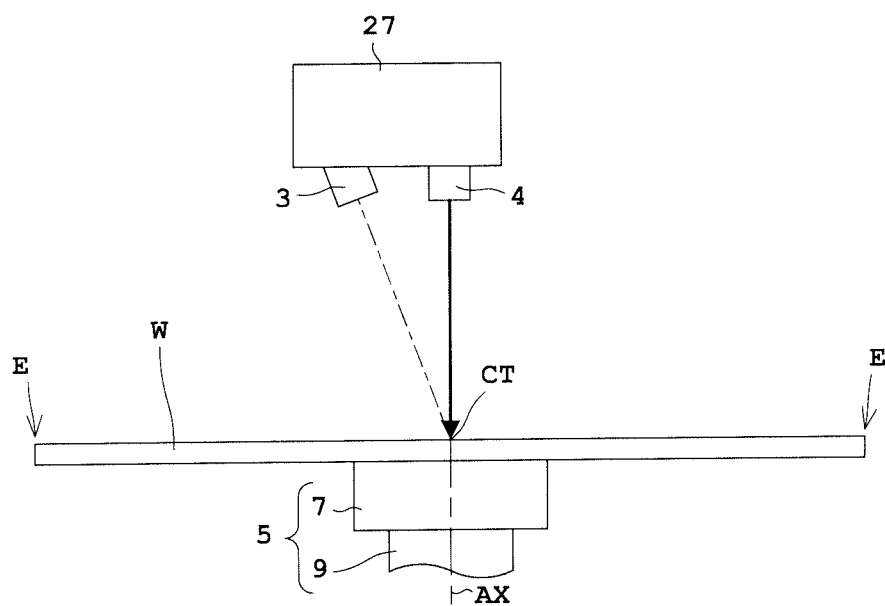

| | SURFACTANT RINSE LIQUID | | |
|---|---|---|---|
| | 0 mm (CENTER) | 10 mm | 30 mm |
| NUMBER OF DEFECTS | 32498 | 10821 | 46768 |
| DEFECT MAP | | | |

DEVELOPING METHOD

CROSS-REFERENCE TO RELATED APPLICATIONS

This application claims priority to Japanese Patent Application No. 2018-056647 filed Mar. 23, 2018, the subject matter of which is incorporated herein by reference in entirety.

BACKGROUND OF THE INVENTION

Technical Field

The present invention relates to a developing method for performing a developing process to substrates such as semiconductor substrates, substrates for flat panel display (FPD) such as liquid crystal display and organic electroluminescence (EL) display, glass substrates for photomask, optical disk substrates, magnetic disk substrates, ceramic substrates, substrates for solar cell, by feeding developer.

Description of the Related Art

A developing device concerning a developing method includes a holding rotator that holds and rotates a substrate, a developing nozzle that dispenses developer to the substrate, and a rinse nozzle that dispenses a rinse liquid to the substrate. See, for example, Japanese Unexamined Patent Publication No. 2016-127204.

Japanese Unexamined Patent Publication No. 2016-127204 possesses the following drawback. Specifically, if the rinse liquid held on the center of the substrate contains air bubbles, a centrifugal force around the center of the substrate becomes small. In addition, the air bubbles are continuously pushed from the above by the rinse liquid dispensed from the rinse nozzle. Accordingly, this may cause the air bubbles to remain on the substrate, leading to a possibility of insufficient rinse to a portion where the air bubbles remains.

Then, the invention described in Japanese Unexamined Patent Publication No. 2016-127204 includes the following feature. That is, dispensation of the developer stops, and thereafter, a rinse nozzle starts dispensation of the rinse liquid (pure water such as deionized water (DIW)) to a given dispensing position on a rotating substrate that is spaced away from the center of the substrate. Thereafter, the rinse liquid dispensed to the dispensing position spreads, whereby the center of the substrate is covered. Moreover, Japanese Unexamined Patent Publication No. 2016-127204 also discloses the feature that the rinse liquid is dispensed from the dispensing position without being moved, but the rinse liquid may be scanned in a reciprocating manner.

SUMMARY OF INVENTION

The currently-used developing method with the method described above has the following drawback. That is, examples of the drawback about Extreme Ultra-Violet (EUV) lithography include pattern collapse of a resist pattern. This occurs due to a rinse process with only pure water such as DIW after performing a developing process by feeding the developer to the substrate. Accordingly, in order to prevent the pattern collapse, the rinse process is performed with a surfactant rinse liquid. However, the surfactant rinse liquid may influence a line width of the resist pattern caused by swelling or slimming of the resist pattern depending on types of the resist. Moreover, when the rinse nozzle continuously dispenses the surfactant rinse liquid to the center of the substrate, the line width becomes larger or smaller locally at and around the center of the substrate. Consequently, such a drawback arises in the currently-used developing method that the rinse process is performed while the line width of the resist pattern within a surface of the substrate is ununiform. Here, the line width means a width in a direction along the surface of the substrate.

The present invention has been made regarding the state of the art noted above, and its object is to provide a developing method that is capable of enhancing uniformity of a line width of a resist pattern within a surface of a substrate during a rinse process after a developing process by feeding developer.

Solution to Problem

The present invention is constituted as stated below to achieve the above object. One aspect of the present invention provides a developing method for performing development to a substrate. The method includes: a developing step of performing a developing process to a substrate rotating around the center thereof by feeding developer to the substrate; a dispensation starting step of starting dispensation of a surfactant rinse liquid from a surfactant rinse nozzle to a position, away from the center of the substrate on the rotating substrate, after the developing step such that the center of the substrate does not enter into a reaching region of the substrate where the surfactant rinse liquid dispensed from the surfactant rinse nozzle firstly reaches; and a covering step of covering the center of the substrate with spread of the surfactant rinse liquid having reached the substrate immediately after the surfactant rinse liquid reaches the substrate; and a fixing step of fixing a point of the reaching region of the surfactant rinse liquid from immediately after the surfactant rinse liquid reaches the substrate until the dispensation of the surfactant rinse liquid stops.

With the developing method according to one embodiment of the present invention, after the developing step is performed by feeding the developer to the substrate, the surfactant rinse nozzle starts the dispensation of the surfactant rinse liquid to the position away from the center of the rotating substrate. This operation is performed such that the center of the substrate does not enter into the reaching region of the substrate where the surfactant rinse liquid dispensed from the surfactant rinse nozzle firstly reaches. Accordingly, the point of the reaching region of the surfactant rinse liquid is dispersed, leading to suppression in locally smaller or larger line width of a resist pattern at the center and around the center of the substrate. Consequently, this achieves enhanced uniformity of the line widths of the resist pattern within the surface of the substrate during the rinse process.

Moreover, since the center of the substrate is covered with the spread of the surfactant rinse liquid having reached the substrate. This achieves rinse of the center of the substrate with the surfactant rinse liquid even when the surfactant rinse liquid is dispensed to the position away from the center of the substrate.

Another aspect of the present invention provides a developing method for performing development to a substrate. The method includes: a developing step of performing a developing process to a substrate rotating around the center thereof by feeding developer to the substrate; a dispensation starting step of starting dispensation of a surfactant rinse liquid from a surfactant rinse nozzle to a position, away from the center of the substrate on the rotating substrate, after the developing step such that the center of the substrate does not enter into a reaching region of the substrate where the surfactant rinse liquid dispensed from the surfactant rinse nozzle firstly reaches; and a covering step of covering the center of the substrate with spread of the surfactant rinse liquid having reached the substrate immediately after the surfactant rinse liquid reaches the substrate; and a shifting step of shifting the reaching region of the surfactant rinse liquid within an area such that the spread of the surfactant rinse liquid having reached the substrate is not away from the center of the substrate after the spread of the surfactant rinse liquid covers the center of the substrate.

With the developing method according to one embodiment of the present invention, after the developing step is performed by feeding the developer to the substrate, the surfactant rinse nozzle starts the dispensation of the surfactant rinse liquid to the position away from the center of the rotating substrate. This operation is performed such that the center of the substrate does not enter into the reaching region of the substrate where the surfactant rinse liquid dispensed from the surfactant rinse nozzle firstly reaches. Accordingly, the point of the reaching region of the surfactant rinse liquid is dispersed, leading to suppression in locally smaller or larger line width of a resist pattern at the center and around the center of the substrate. Moreover, shifting the reaching region of the surfactant rinse liquid allows a more efficiently dispersed point of the reaching region of the surfactant rinse liquid. Consequently, this achieves enhanced uniformity of the line widths of the resist pattern within the surface of the substrate during the rinse process.

Moreover, since the center of the substrate is covered with the spread of the surfactant rinse liquid having reached the substrate. This achieves rinse of the center of the substrate with the surfactant rinse liquid even when the surfactant rinse liquid is dispensed to the position away from the center of the substrate.

Moreover, when the center and around the center on the surface of the substrate are dried while the point of the reaching region of the surfactant rinse liquid is shifted, such as a dissolution product of the resist that remains on the surface of the substrate without being exhausted may adhere to the center and around the center of the substrate. This adhesion substance is incapable of being rinsed off easily with the surfactant rinse liquid. The point of the reaching region of the surfactant rinse liquid is shifted within the area where the spread of the surfactant rinse liquid having reached the substrate is not away from the center of the substrate. Accordingly, when the point of the reaching region of the surfactant rinse liquid is shifted, the center of the substrate is constantly covered with the surfactant rinse liquid. Consequently, the center of the substrate is not dried. In addition, such as a dissolution product of the resist is prevented from adhering to the center and around the center of the substrate, leading to reduction in defect caused by the adhesion substance.

Moreover, it is preferred in the developing method described above that the shifting step of shifting reaching region includes causing the reaching region to reciprocate along a route containing the center of the substrate, the route being set to have two return positions across the center of the substrate.

For instance, assumed that a return position for reciprocation are set on the center of the substrate, a relatively longer time is required that the reaching region of the surfactant rinse liquid is disposed at the center of the substrate. In contrast to this, with the above-described case, the reciprocation is performed between the two return positions set across the center of the substrate. Accordingly, a relatively shorter time is required that the reaching region of the surfactant rinse liquid is disposed at the center of the substrate. This achieves suppression in local smaller or larger line width of the resist pattern at the center and around the center of the substrate.

Moreover, it is preferred that the developing method described above further includes a pure water dispensation starting step of starting dispensation of pure water from a pure water rinse nozzle onto the rotating substrate after the developing step before the dispensation starting step with the surfactant rinse liquid, and that the dispensation starting step with the surfactant rinse liquid is performed simultaneously with stopping the dispensation of the pure water. This achieves the rinse process using the pure water and the surfactant rinse liquid.

Moreover, it is preferred that the developing method described above further includes a rotating step of rotating the substrate at a first rotation speed while the dispensation of the pure water starts from the pure water rinse nozzle, and thereafter rotating the substrate at a second rotation speed, faster than the first rotation speed, for a pre-determined period of time while the pure water is dispensed. That is, when the rinse process is performed to the substrate rotating at the first rotation speed with the pure water, the rotation speed of the substrate is increased from the first rotation speed up to the second rotation speed for a predetermined period of time. This allows easy discharge of the dissolution product of the resist, for example, to the outside of the substrate.

Moreover, it is preferable in the developing method that the first rotation speed and the second rotation speed fall within a range between 500 rpm or more to 2000 rpm or less. When first rotation speed and the second rotation speed fall within a range between 500 rpm or more to 2000 rpm or less, enhanced uniformity of the line widths of the resist pattern is obtainable within the surface of the substrate during the rinse process.

Moreover, it is preferred that the developing method described above further includes a rotating step of rotating the substrate at a speed in a range of 500 rpm or more to 2000 rpm or less after the dispensation of the surfactant rinse liquid from the surfactant rinse nozzle starts until the dispensation of the surfactant rinse liquid stops. When the substrate is rotated at the rotation speed in a range of 500 rpm or more to 2000 rpm or less after the surfactant rinse process starts dispensation of the surfactant rinse liquid until the dispensation of the surfactant rinse liquid stops, enhanced uniformity of the line widths of the resist pattern is obtainable within the surface of the substrate during the rinse process.

Advantageous Effects of Invention

The developing method according to the present invention is capable of enhancing uniformity of a line width of a resist pattern within a surface of a substrate during the rinse process after a developing process by feeding developer.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 2A illustrates a first rinse nozzle, and FIG. 2B illustrates a second rinse nozzle.

FIG. 8B is a plan view of a route for the reciprocation, two return positions, and the like.

FIG. 9B is a plan view of a route for the reciprocation, two return positions, and the like.

FIG. 10B is a plan view of a route for the reciprocation, two return positions, and the like.

FIG. 11B is a plan view of a route for the reciprocation, two return positions, and the like.

EMBODIMENT 1

Figure 1:
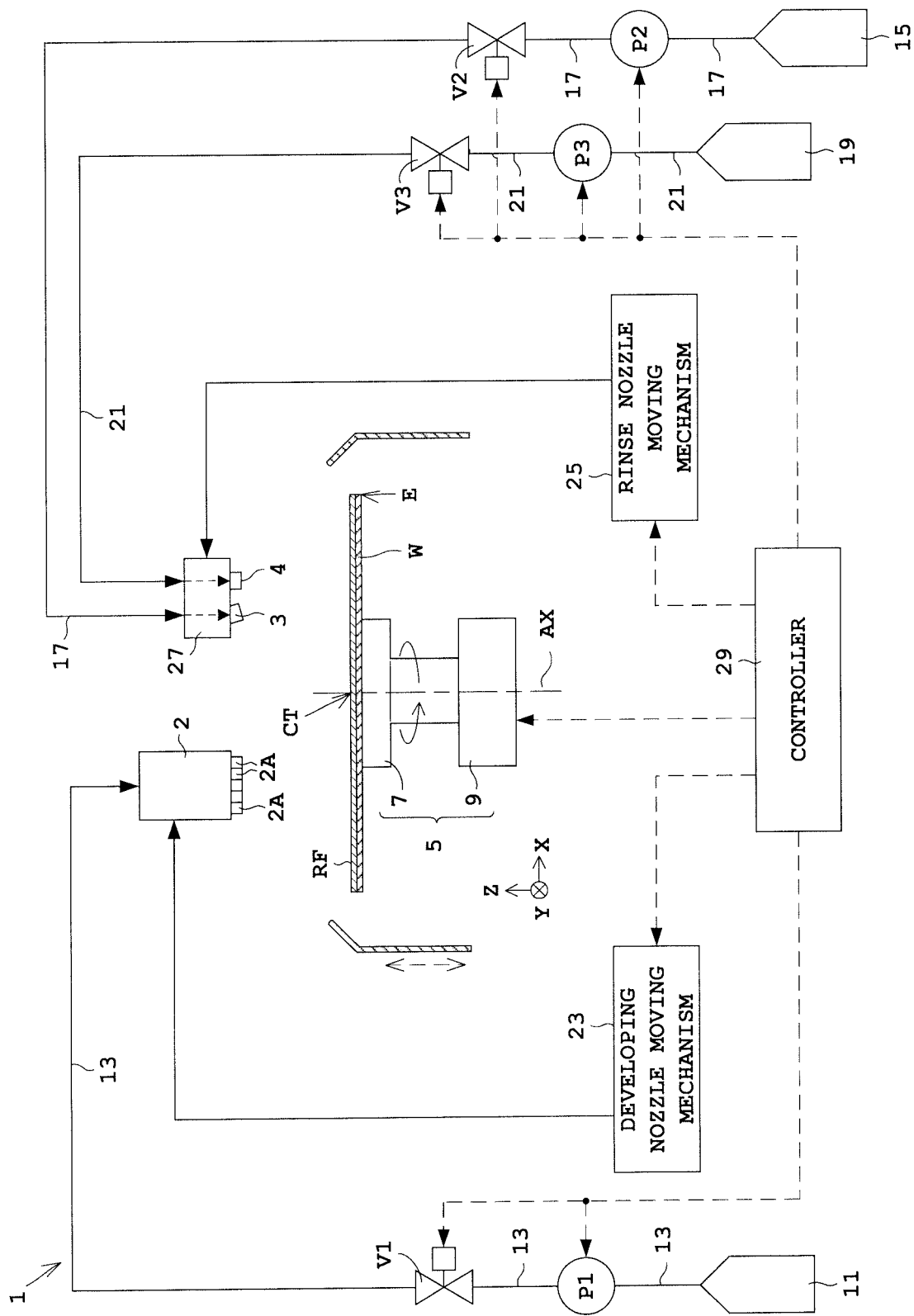
FIG. 1 schematically illustrates a developing device according to Embodiment 1.

The following describes Embodiment 1 of the present invention with reference to drawings. FIG. 1 schematically illustrates a developing device 1. FIG. 2A illustrates a first rinse nozzle 3. FIG. 2B illustrates a second rinse nozzle 4.

<Configuration of Developing Device 1>

Reference is made to FIG. 1. The developing device 1 includes a developing nozzle 2, a first rinse nozzle 3, a second rinse nozzle 4, and a holding rotator 5.

The developing nozzle 2 dispenses developer to a substrate W. The developing nozzle 2 includes a plurality of (e.g., 5) dispensing nozzles 2A that are arranged in line in an X direction as a moving direction. This achieves wide dispensation of the developer, leading to rapid application of the developer over the substrate W entirely.

The first rinse nozzle 3 dispenses a pure water such as deionized water (DIW) to the substrate W. The second rinse nozzle 4 dispenses a surfactant rinse liquid to the substrate W. Examples of the surfactant rinse liquid include a nonionic surfactant, a cationic surfactant, an anionic surfactant, and an amphoteric surfactant. The first rinse nozzle 3 corresponds to the pure water rinse nozzle in the present invention. The second rinse nozzle 4 corresponds to the surfactant rinse nozzle in the present invention.

The holding rotator 5 rotates the substrate W while holding the substrate W substantially horizontally. The holding rotator 5 includes a spin chuck 7 and a rotary drive unit 9. The spin chuck 7 is rotatable around a rotary axis AX. The spin chuck 7 suction-holds a rear face of the substrate W, thereby holding the substrate W. The rotary drive unit 9 causes the spin chuck 7 to rotate around the rotation axis AX. Here, it is assumed that the rotary axis AX passes through the center CT of the substrate W. The rotary drive unit 9 is formed by an electric motor and the like.

The developer is supplied from a developer supplying source 11 to the developing nozzle 2 through a developer pipe 13. An on-off valve V1 and a pump P1 are provided on the developer pipe 13. The on-off valve V1 performs supply and stops the supply of the developer. The pump P1 feeds the developer to the developing nozzle 2.

The pure water is supplied from a pure water supplying source 15 to the first rinse nozzle 3 through a pure water pipe 17. An on-off valve V2 and a pump P2 are provided on the pure water pipe 17. The on-off valve V2 performs supply and stops the supply of the pure water. The pump P2 feeds the pure water to the first rinse nozzle 3.

A surfactant rinse liquid is supplied from a surfactant rinse liquid supplying source 19 to a second rinse nozzle 4 through a surfactant rinse liquid pipe 21. An on-off valve V3 and a pump P3 are provided on the surfactant rinse liquid pipe 21. The on-off valve V3 performs supply and stops the supply of the surfactant rinse liquid. The pump P3 feeds the surfactant rinse liquid to the second rinse nozzle 4.

The developing device 1 includes a developing nozzle moving mechanism 23 that causes the developing nozzle 2 to move to any positions, and a rinse nozzle moving mechanism 25 that causes the first rinse nozzle 3 and the second rinse nozzle 4 to move to any positions individually. The first rinse nozzle 3 and the second rinse nozzle 4 are provided on a holder block 27. Accordingly, the rinse nozzle moving mechanism 25 causes the first rinse nozzle 3 and the second rinse nozzle 4 to move integrally.

As illustrated in FIG. 2A, the first rinse nozzle 3 dispenses pure water to the surface of the substrate W not vertically but obliquely. As illustrated in FIG. 2B, the second rinse nozzle 4 dispenses the surfactant rinse liquid to the substrate W vertically, i.e., directly below the substrate W. Specifically, the first rinse nozzle 3 and the second rinse nozzle 4 are configured to dispense the pure water and the surfactant rinse liquid, respectively, to the same point (e.g., the center CT of the substrate W) without any variation in position of the holder block 27.

Reference is made again to FIG. 1. The developing device 1 includes one or more controllers 29, and a memory unit (at least either a memory or a storage) not shown. The controller 29 includes a central processing unit (CPU). The controller 29 performs control to each element of the developing device 1 (e.g., the pumps P1 to P3, the on-off valves V1 to V3, the holding rotator 5, the developing nozzle moving mechanism 23, and the rinse nozzle moving mechanism 25). The memory unit stores operational programs for the developing device 1.

<Configuration of Developing Nozzle Moving Mechanism 23 and Rinse Nozzle Moving Mechanism 25>

Figure 3:
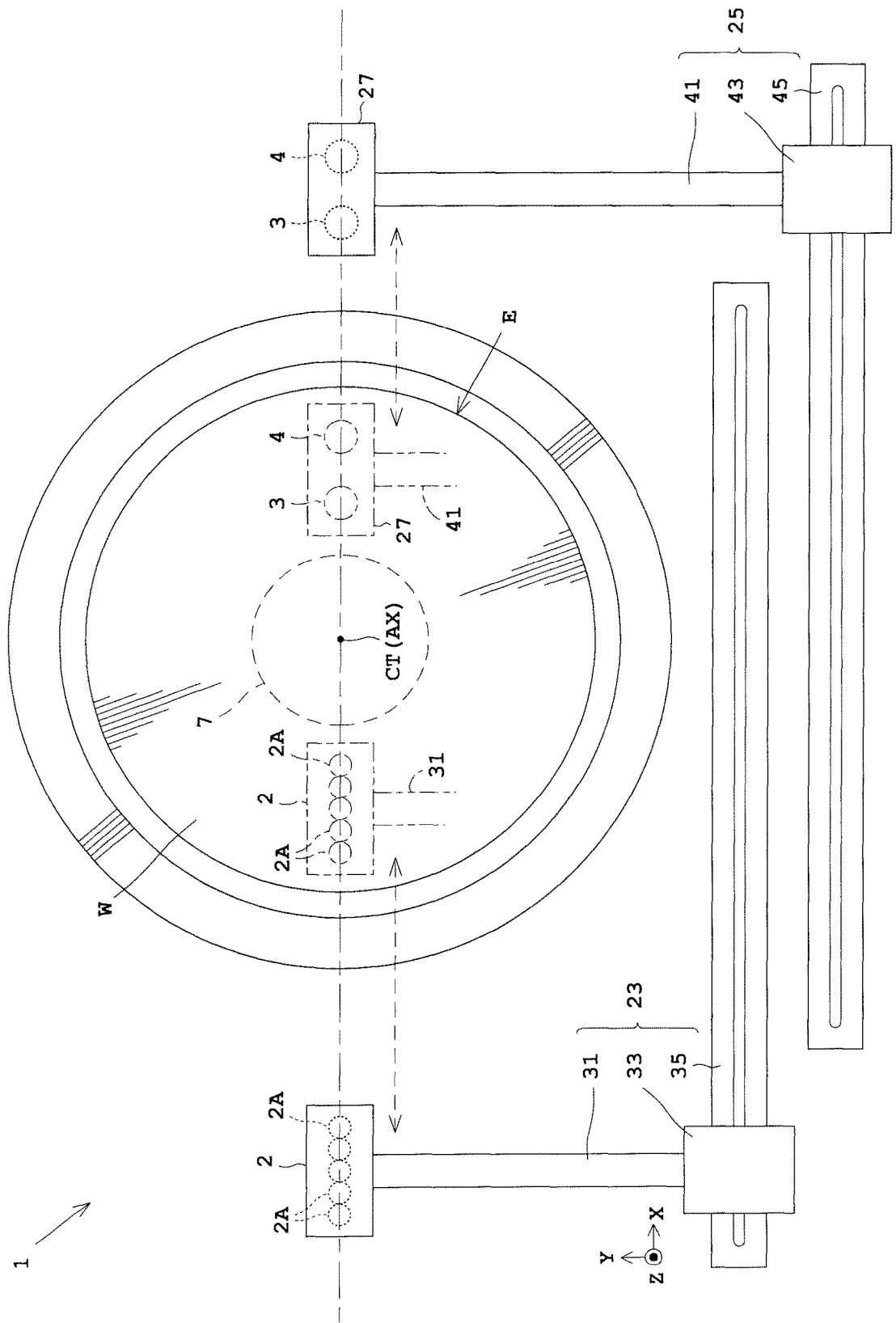
FIG. 3 schematically illustrates a developing nozzle moving mechanism and a rinse nozzle moving mechanism.

FIG. 3 is a plan view of the developing nozzle moving mechanism 23 and the rinse nozzle moving mechanism 25.

The developing nozzle moving mechanism 23 causes the developing nozzle 2 to move in an upward/downward direction (Z direction) and a first given direction along the surface of the substrate W (e.g., X direction). The developing nozzle moving mechanism 23 includes an arm 31, an upward/downward moving mechanism 33, and a planar moving mechanism 35. The arm 31 supports the developing nozzle 2. The upward/downward moving mechanism 33 causes the arm 31 to move in the upward/downward direction, thereby causing the developing nozzle 2 to move in the upward/downward direction. The planar moving mechanism 35 causes the upward/downward moving mechanism 33 to move in the first direction, thereby causing the developing nozzle 2 and the arm 31 to move in the first direction. The developing nozzle 2 includes five dispensing nozzles 2A that are arranged in line in the first direction.

The rinse nozzle moving mechanism 25 causes the developing nozzle 2 to move in the upward/downward direction (Z direction) and the first given direction along the surface of the substrate W (e.g., X direction). The rinse nozzle moving mechanism 25 includes an arm 41, an upward/downward moving mechanism 43, and a planar moving mechanism 45. The arm 41 holds the holder block 27 where the first rinse nozzle 3 and the second rinse nozzle 4 are provided. The upward/downward moving mechanism 43 causes the arm 41 to move in the upward/downward direction, thereby causing the first rinse nozzle 3 and the second rinse nozzle 4 and the like to move in the upward/downward direction. The planar moving mechanism 45 causes the upward/downward moving mechanism 43 to move in the first direction, thereby causing the first rinse nozzle 3, the second rinse nozzle 4, the arm 41 and the like to move in the first direction.

The upward/downward moving mechanisms 33, 43 and the planar moving mechanisms 35, 45 each include an electric motor, a screw shaft, a slide member where an internal thread engaging with the screw shaft is provided, and a guide rail that guides the slide member.

<Operation of Developing Device 1 (Developing Method)>

Figure 4:
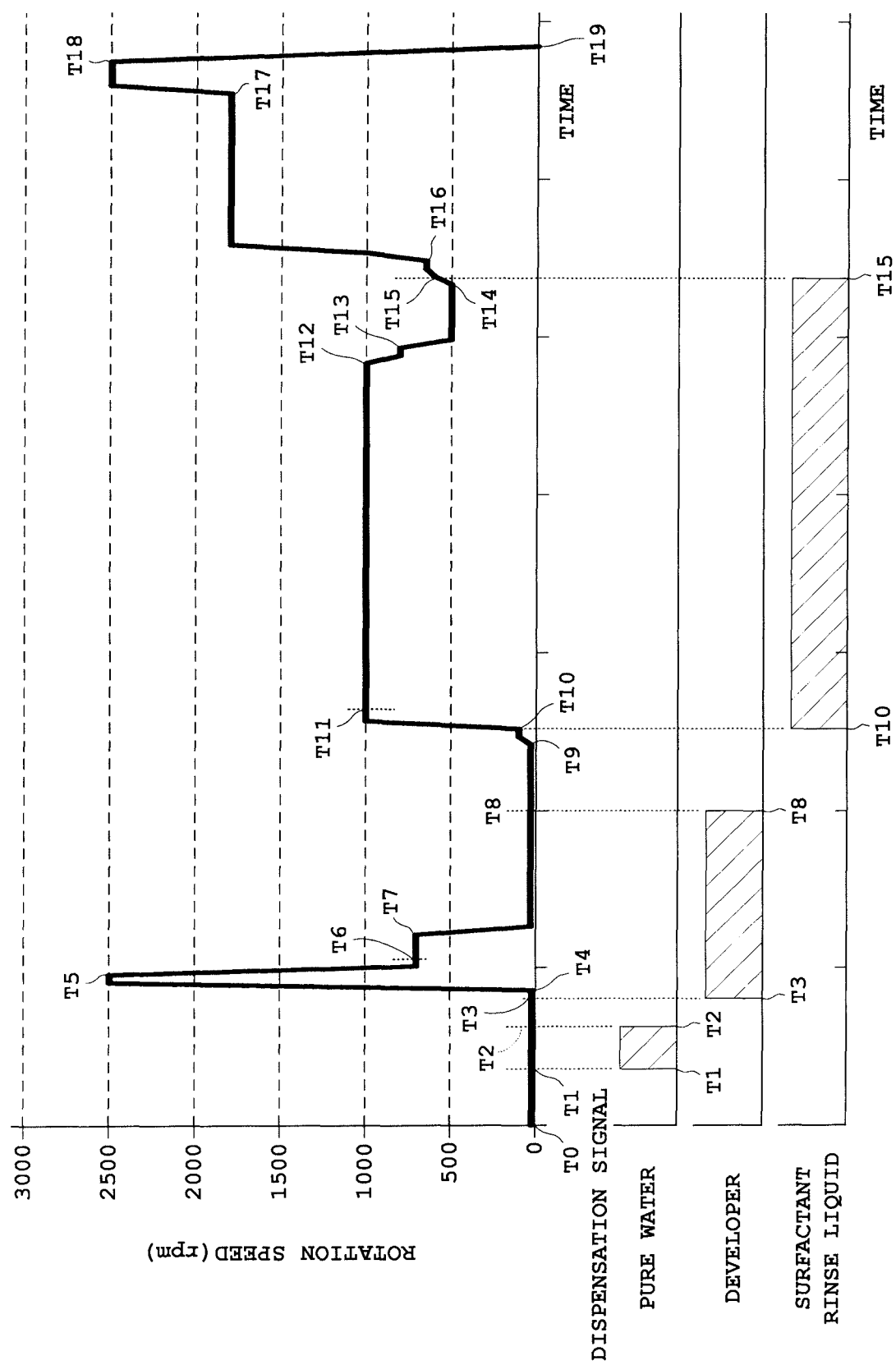
FIG. 4 schematically illustrates one example of a timing chart of a developing step according to Embodiment 1.

Description will be given next of operations of the developing device 1 with reference to FIG. 4. FIG. 4 is one example of a timing chart of a developing step. The developing step includes a pre-wet process (time T0 to T3), a main developing process (time T3 to T10), a rinse process (time T10 to T16), and a dry process (time T16 to T19).

In FIG. 1, a transport mechanism, not shown, transports the substrate W to the spin chuck 7 on the holding rotator 5. The holding rotator 5 suction-holds a rear face of the substrate W, thereby holding the substrate W. The substrate W includes a resist film (photoresist film) RF formed thereon (see FIG. 1) where a given pattern is exposed. It is also assumed that the substrate W includes the resist film RF. For instance, a circular substrate W whose diameter is 300 mm is used. Note that the substrate W may have a diameter of other than 300 mm.

[Step S01] Pre-Wet Process

The pre-wet process is performed for making easy spread of developer Ldev to be dispensed over the substrate W. At the time T0 in FIG. 4, the holding rotator 5 causes the held substrate W to rotate at a speed of 20 rpm. Moreover, the rinse nozzle moving mechanism 25 causes the first rinse nozzle 3 to move from a given standby position outside of the substrate W to a position above and around the center CT of the substrate W.

At the time T1 after the first rinse nozzle 3 is moved, the controller 29 causes the first rinse nozzle 3 to start dispensation of the pure water to the center of the substrate W as illustrated in FIG. 2A. At this time, the on-off valve V2 is switched from an OFF state to an ON state. The pump P2 feeds the pure water Lpw from the pure water supplying source 15 to the first rinse nozzle 3. The first rinse nozzle 3 dispenses the pure water for a predetermined period of time (time T1 to T2). The pure water reached on the substrate W spreads over the surface of the substrate W due to rotation of the substrate W or impact upon the reach of the pure water on the substrate W.

At this time T2, the on-off valve V2 is switched from the ON state to the OFF state. This achieves stopping dispensation of the pure water to the substrate W. Before the time T3 elapses (after the time T2 elapses), the developing nozzle moving mechanism 23 causes the developing nozzle 2, instead of the first rinse nozzle 3, to move to a position above and around the center CT of the substrate W.

[Step S02] Main Developing Process (Developer Dispensing Process and Developer Puddle Process)

The main developing process includes a developer dispensing process (time T3 to T8) and a developer puddle process (time T8 to T10).

Figure 5:
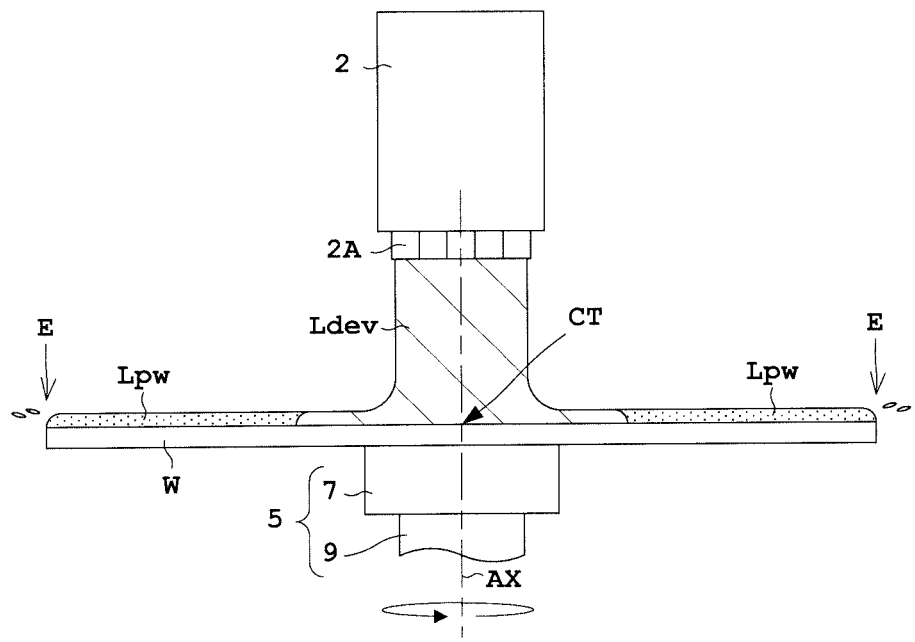
FIG. 5 illustrates a main developing step.

At the time T3, the controller 29 causes the developing nozzle 2 to start dispensation of the developer Ldev to the center CT of the substrate W rotating at the speed of 20 rpm (see FIG. 5). At this time, the on-off valve V1 is switched from the OFF state to the ON state. The pump P1 feeds the developer Ldev from the developer supplying source 11 to the developing nozzle 2. The substrate W has a film of the pure water Lpw formed thereon. The developer Ldev dispensed from the developing nozzle 2 reaches the center CT of the substrate W via the film of the pure water Lpw on the substrate W. The developer Ldev is continuously fed for a period of time T3 to T8.

At time T4, the controller 29 operates the holding rotator 5 to increase the rotation speed of the substrate W up to 2500 rpm while dispensing the developer Ldev. This causes the pure water Lpw and the developer Ldev to spread over the substrate W, and causes the redundant pure water Lpw and the developer Ldev to be discharged out of the substrate W. At time T5, the controller 29 operates the holding rotator 5 to decrease the rotation speed of the substrate W from 2500 rpm to 700 rpm.

During a period of time T6 to T7 after the rotation speed of the substrate W is decreased to 700 rpm, the developing nozzle 2 is caused to perform one-time reciprocation (reciprocal scan). At this time, the reciprocation is performed within a given distance from the center CT of the substrate W (e.g., 100 mm) That is, the reciprocation is performed within a region where the reaching point of the developer Ldev dispensed from the developing nozzle 2 does not reach an outer edge of the substrate W. This achieves enhanced uniformity of the line widths of the resist pattern within the surface of the substrate during the developing process. In addition, when the developing nozzle 2 is moved to and around the outer edge of the substrate W, mists of the developer Ldev are likely to rise. For instance, when the mists fall down onto the substrate W after the dry process, the substrate W may suffer some influence. The developing nozzle 2 is not moved to the outer edge of the substrate W, leading to suppression in mist of the developer Ldev. Here, one-time reciprocation of the developing nozzle 2 (the reaching point of the developer Ldev) is not limitative. Two or more-time reciprocation is applicable.

At time T7, the holding rotator 5 decreases the rotation speed of the substrate W from 700 rpm to 30 rpm. This achieves a suppressed discharge amount of the developer Ldev from the substrate W outside of the substrate W, whereby a puddle of the developer Ldev is formed on the substrate W. Moreover, the redundant developer Ldev is discharged outside of the substrate W.

At time T8, the developing nozzle 2 stops dispensing the developer Ldev. At this time, the on-off valve V1 is switched from the ON state to the OFF state. In addition, the substrate W continuously rotates while the puddle of the developer Ldev is formed on the substrate W. At time T9, the holding rotator 5 increases the rotation speed of the substrate W from 30 rpm to 100 rpm. This obtains the decreased amount of the developer Ldev held on the substrate W. After the time T8 elapses and before the time T10 elapses, the rinse nozzle moving mechanism 25 in FIG. 3 causes the second rinse nozzle 4, instead of the developing nozzle 2, to move to a position above the center CT of the substrate W. Here, the developing nozzle moving mechanism 23 causes the developing nozzle 2 to return to the standby position.

[Step S03] Rinse Process

The following describes a rinse process as the characteristic of the present invention. At time T10, the holding rotator 5 increases the rotation speed of the substrate W from 100 rpm to 1000 rpm. Moreover, at the time T10, the controller 29 causes the second rinse nozzle 4 to start dispensation of a surfactant rinse liquid Lsf. At this time, the on-off valve V3 is switched from the OFF state to the ON state. The pump P3 feeds the surfactant rinse liquid Lsf from the surfactant rinse liquid supplying source 19 to the second rinse nozzle 4.

Now the drawback of the present invention is to be described. For instance, in the EUV lithography, when the rinse process is performed only with the pure water such as DIW after the main developing process (developing process) of dispensing the developer Ldev to the substrate W, such a drawback as pattern collapse of the resist pattern may arise. In order to prevent the drawback, the surfactant rinse liquid Lsf is used as the rinse liquid. However, the surfactant rinse liquid may influence a line width of the resist pattern caused by swelling or slimming of the resist pattern. In other words, the line width of the resist pattern becomes larger or smaller depending on compatibility with an ingredient of the resist. Moreover, when the rinse nozzle continuously dispenses the surfactant rinse liquid to the center of the substrate, the line width becomes larger or smaller locally at and around the center CT of the substrate W. Accordingly, this leads to another drawback of the ununiform line width over the substrate.

Figure 6:
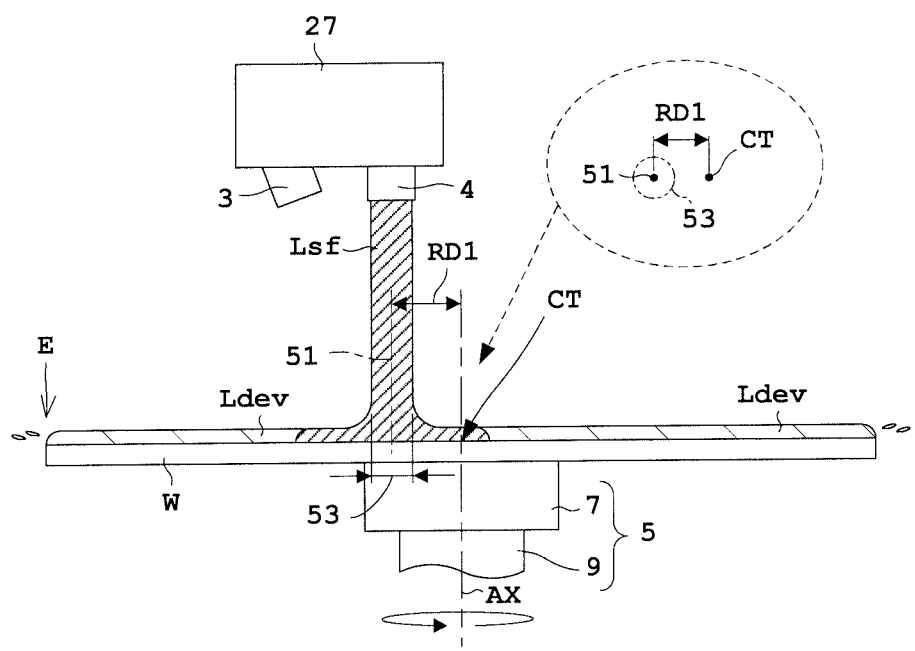
FIG. 6 illustrates dispensation of a surfactant rinse liquid.

Then, as illustrated in FIG. 6, the controller 29 causes the second rinse nozzle 4 to start dispensing the surfactant rinse liquid Lsf to a reaching point 51, away from the center CT of the rotating substrate W, after the developing process (development). The second rinse nozzle 4 starts dispensing the surfactant rinse liquid Lsf such that the center CT of the substrate W does not enter into a reaching region 53 of the substrate W where the surfactant rinse liquid Lsf dispensed from the second rinse nozzle 4 firstly reaches. Specifically, the above operation is performed such that the surfactant rinse liquid Lsf dispensed from the second rinse nozzle 4 does not reach the center CT of the substrate W. Here, the reaching point 51 is, for example, a position away from the center CT of the substrate W by 10 mm. However, this is not limitative. The reaching point 51 may be a position where the center CT does not enter into the reaching region 53 and is away from the center CT by a distance of less than 10 mm.

Moreover, the controller 29 performs control to cover the center CT of the substrate W with the spread surfactant rinse liquid Lsf on the substrate W immediately after the surfactant rinse liquid Lsf reaches the substrate W. This is because the developer Ldev and the dissolution product of the resist are incapable of being rinsed off at the center CT of the substrate W if the center CT of the substrate W is not covered with the surfactant rinse liquid Lsf. Here, the second rinse nozzle 4 has a dispensation port whose diameter is 3 mm, for example. The second rinse nozzle 4 dispenses the surfactant rinse liquid Lsf at a flow rate of 2 cc/sec., for example. In FIG. 4, the surfactant rinse liquid Lsf is continuously fed for a period of time T10 to T15.

At the time T11 after the rotation speed of the substrate W increases to 1000 rpm, the rinse nozzle moving mechanism 25 illustrated in FIG. 3 causes the second rinse nozzle 4 to reciprocate. The controller 29 causes the point 51 of the reaching region 53 of the surfactant rinse liquid Lsf to reciprocate within an area where the spread of the surfactant rinse liquid Lsf contacting the substrate W does not move away from the center CT of the substrate W after the center CT of the substrate W is covered with the spread of the surfactant rinse liquid Lsf. The area where the spread of the surfactant rinse liquid Lsf does not move away from the center CT of the substrate W is, for example, an area away from the center CT of the substrate W by a distance of 10 mm.

Figure 7A:
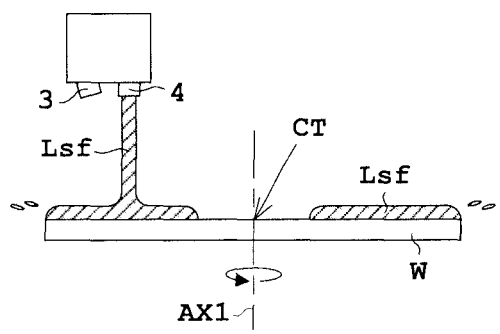
FIG. 7A illustrates the case where spread of the surfactant rinse liquid contacting on a substrate is shifted away from the center of the substrate.
Figure 7B:
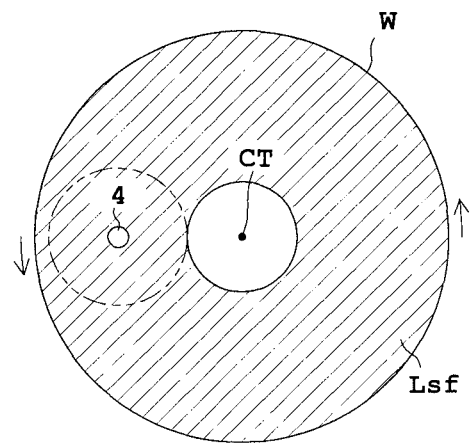
FIG. 7B is a plan view of FIG. 7A.

FIG. 7A illustrates the case where the spread of the surfactant rinse liquid Lsf that is dispensed from the second rinse nozzle 4 and contacts on the substrate W is shifted from the center CT of the substrate W. FIG. 7B is a plan view of FIG. 7A. In this case, the center and around the center of the substrate W not covered with the surfactant rinse liquid Lsf are dried. If the center CT and around the center CT of the substrate W are dried, such as a dissolution product of the resist that remains in the developer Ldev or the surfactant rinse liquid Lsf may adhere to the center CT and around the center CT of the substrate W. If the dissolution product of the resist adheres, the subsequent rinse process with the surfactant rinse liquid Lsf becomes difficult. Accordingly, it is needed to cover the center CT of the substrate W with the surfactant rinse liquid Lsf during movement of the reaching point 51 such that the center CT of the substrate W is not dried.

Figure 8A:
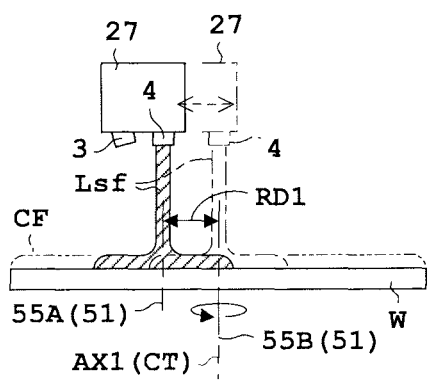
FIG. 8A illustrates reciprocation of the second rinse nozzle.
Figure 8B:
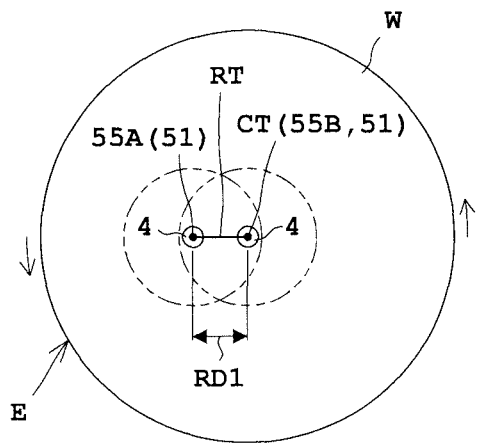

Accordingly, the rinse nozzle moving mechanism 25 causes the second rinse nozzle 4, i.e., the reaching point 51 of the surfactant rinse liquid Lsf to reciprocate within an area such as one away from the center CT of the substrate W by a distance of 10 mm. In FIGS. 8A and 8B, the rinse nozzle moving mechanism 25 causes the reaching point 51 (the second rinse nozzle 4) to reciprocate between the center CT of the substrate W and a position spaced away from the center CT of the substrate W by a distance RD1.

Figure 9A:
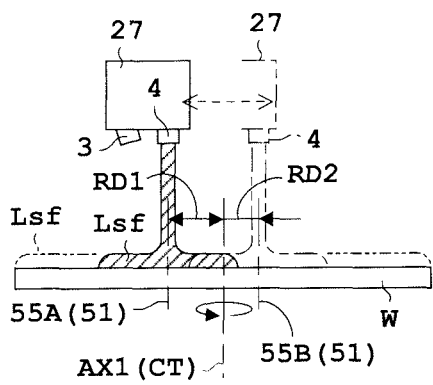
FIG. 9A illustrates reciprocation of the second rinse nozzle according to one modification.
Figure 9B:
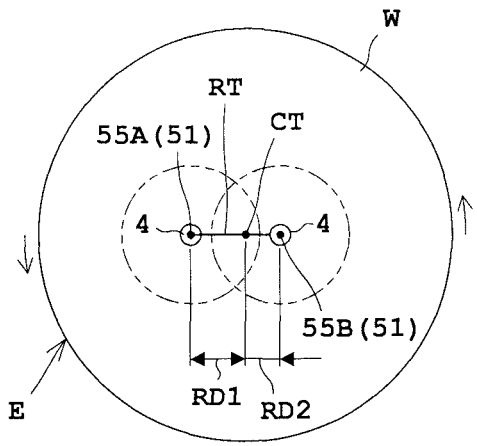

Moreover, as illustrated in FIGS. 9A and 9B, the rinse nozzle moving mechanism 25 may cause the reaching point 51 (the second rinse nozzle 4) to reciprocate along a linear route RT containing the center CT of the substrate W. The route RT includes two return positions 55A, 55B set thereon across the center CT of the substrate W. In FIGS. 9A and 9B, a distance RD2 between the return position 55B and the center CT of the substrate W is smaller than the distance RD1 between the return position 55A and the center CT of the substrate W.

Figure 10A:
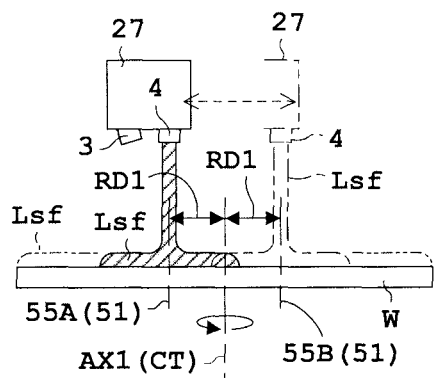
FIG. 10A illustrates reciprocation of the second rinse nozzle according to another modification.
Figure 10B:
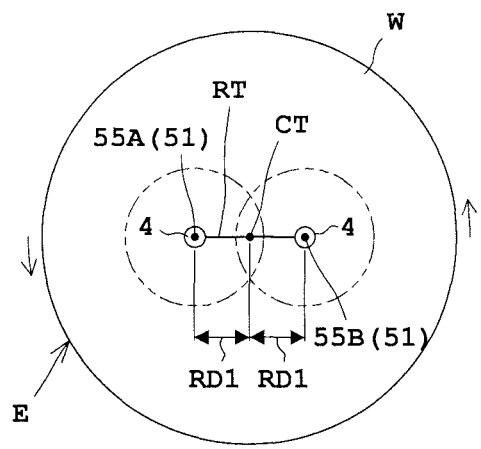
Figure 11A:
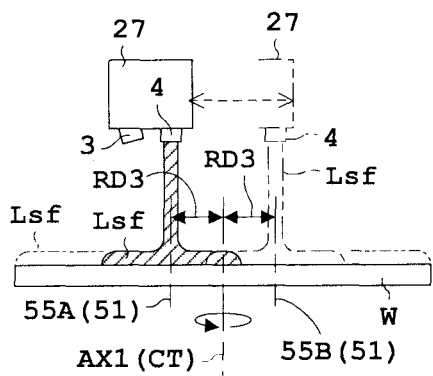
FIG. 11A illustrates reciprocation of the second rinse nozzle according to another modification.
Figure 11B:
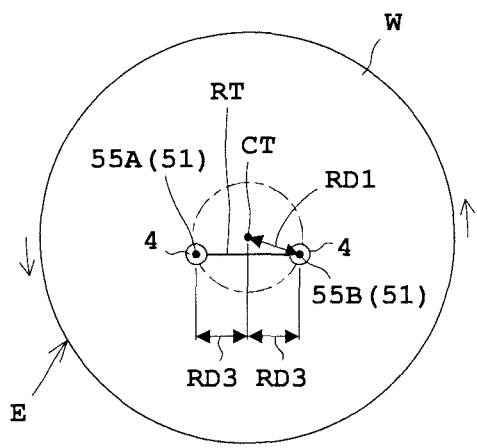

Moreover, as illustrated in FIGS. 10A and 10B, the distance RD1 between the return position 55A and the center CT of the substrate W may be equal to the distance RD1 between the return position 55B and the center CT of the substrate W. That is, the rinse nozzle moving mechanism 25 may cause the reaching point 51 (the second rinse nozzle 4) to reciprocate along the route RT that corresponds to a diameter of a circle whose radius is the distance RD1. Moreover, as illustrated in FIGS. 11A and 11b, the linear route RT connecting the two return positions 55A, 55B may not necessarily pass the center CT of the substrate W. In this case, the route RT is twice as long as a distance RD3.

The route RT is not limited to a linear shape, but may be a circular shape. The point 51 may not necessarily be moved in a reciprocation manner. Alternatively, the point 51 may be moved so as to draw a triangle or other two-dimensional line or trace within an area away from the center CT of the substrate W by a distance of 10 mm. Moreover, the point 51 may be moved only along a forward path of the linear route RT. Moreover, it is preferred that the route RT is set as a distance where the reaching region 53 of the return position 55A does not overlap the reaching region 53 of the return position 55B. For instance, the route RT is set longer than half the width of the reaching region 53.

The reaching point 51 of the surfactant rinse liquid Lsf reciprocates one or more times depending on a dispensation time of the surfactant rinse liquid Lsf. At time T12, the holding rotator 5 decreases the rotation speed of the substrate W from 1000 rpm to 800 rpm. Moreover, during a period of time T12 to T13, the last return path of the route RT of the reciprocation may be performed. Thereafter, the reaching point 51 (second rinse nozzle 4) is caused to return to a position away from the center CT of the substrate W, as a dispensation start position of the surfactant rinse liquid Lsf, by the distance RD1 (e.g., 10 mm). At time T13 after the reaching point 51 returns to the dispensation start position, the holding rotator 5 operates to decrease the rotation speed of the substrate W from 800 rpm to 500 rpm. Decreasing the rotation speed achieves suppressed discharge of the surfactant rinse liquid Lsf from the substrate W, leading to more effective holding of the surfactant rinse liquid Lsf on the substrate W in comparison with the case where the substrate W rotates at the speed of 1000 rpm.

For a period of time T14 to T16, the holding rotator 5 increases the rotation speed of the substrate W from 500 rpm to 650 rpm in a step manner. At the time T15, the second rinse nozzle 4 is caused to stop dispensation of the surfactant rinse liquid Lsf. At this time, the on-off valve V3 is switched from the ON state to the OFF state. The rinse nozzle moving mechanism 25 causes the first rinse nozzle 3 and the second rinse nozzle 4 to move back to the standby position individually.

Here in the rinse process in FIG. 4, the substrate W rotates at speeds of 500 rpm or more to 1000 rpm or less. However, the substrate W may rotate at speeds of 500 rpm or more to 2000 rpm or less after the second rinse nozzle 4 starts dispensation of the surfactant rinse liquid Lsf at time T10 until stopping the dispensation of the surfactant rinse liquid. Moreover, it is preferred that the rotation speed of the substrate W is from 800 rpm or more to 1000 or less while the reaching point 51 (second rinse nozzle 4) is caused to reciprocate.

[Step S04] Drying Process

At time T16, the holding rotator 5 increases the rotation speed of the substrate W from 650 rpm to 1800 rpm. Moreover, the substrate W keeps rotating at the speed of 1800 rpm for a predetermined period of time. Thereafter, at time T17, the holding rotator 5 further increases the rotation speed of the substrate W from 1800 rpm to 2500 rpm. This further achieves discharge of the surfactant rinse liquid Lsf outside of the substrate W. The substrate W keeps rotating at the speed of 2500 rpm for a predetermined period of time.

Thereafter, at time T18, the holding rotator 5 stops rotation of the substrate W. At time T19, the substrate W actually stops (0 rpm).

After the substrate W stops rotation, i.e., after the developing process of Steps S01 to S04 is completed, the holding rotator 5 releases its holding of the substrate W. A transport mechanism, not shown, causes the substrate W on the spin chuck 7 of the holding rotator 5 to move to another processing unit.

According to this embodiment, after the developing process is performed by feeding the developer Ldev to the substrate W, the second rinse nozzle 4 starts dispensing the surfactant rinse liquid Lsf to the position away from the center CT of the rotating substrate W. Such an operation performed such that the center CT of the substrate W is not contained in the reaching region 53 of the substrate W where the surfactant rinse liquid Lsf dispensed from the second rinse nozzle 4 firstly reaches. Accordingly, the point 51 of the reaching region 53 of the surfactant rinse liquid Lsf is dispersed, leading to suppression in locally smaller or larger line width of the resist pattern at the center and around (periphery of) the center CT of the substrate W. Moreover, causing the point 51 of the reaching region 53 of the surfactant rinse liquid Lsf to reciprocate allows more efficiently dispersed point of the reaching region 53 of the surfactant rinse liquid Lsf. Consequently, this achieves enhanced uniformity of the line widths of the resist pattern within the surface of the substrate W during the rinse process.

Moreover, since the center CT of the substrate W is covered with the spread of the surfactant rinse liquid Lsf having reached the substrate W. This achieves rinse of the center CT of the substrate W with the surfactant rinse liquid Lsf even when the surfactant rinse liquid Lsf is dispensed to the point away from the center CT of the substrate W.

Moreover, in the developing method according to the embodiment of the present invention, the point 51 of the reaching region 53 of the surfactant rinse liquid Lsf dispensed from the second rinse nozzle 4 to reach the substrate W reciprocates within an area where the spread of the surfactant rinse liquid Lsf having reached the substrate W does not move away from the center CT of the substrate W (within an area from the center CT of the substrate W by the predetermined distance RD1) after the center CT of the substrate W is covered with the spread of the surfactant rinse liquid Lsf.

When the center CT and around the center on the surface of the substrate W are dried while the reaching point 51 of the surfactant rinse liquid Lsf reciprocates, such as a dissolution product of the remaining resist may adhere to the center and around the center CT of the substrate W. This adhesion substance is incapable of being rinsed off easily with the surfactant rinse liquid Lsf. The reaching point 51 of the surfactant rinse liquid Lsf reciprocates within the area where the spread of the surfactant rinse liquid Lsf having reached the substrate W is not away from the center CT of the substrate W (within an area from the center CT of the substrate W by the predetermined distance RD1). Accordingly, when the reaching point 51 of the surfactant rinse liquid Lsf reciprocates, the center CT of the substrate W is constantly covered with the surfactant rinse liquid Lsf Consequently, the center CT of the substrate W is not dried. In addition, such as the dissolution product of the resist is prevented from adhesion, leading to reduction in defect caused by the adhesion substance.

Moreover, the reaching point 51 of the surfactant rinse liquid Lsf dispensed from the second rinse nozzle 4 onto the substrate W reciprocates along the route having the two return positions across the center CT of the substrate W and containing the center CT of the substrate W.

For instance, assumed that one of the return positions for reciprocation is set on the center CT of the substrate W, a relatively longer time is required that the reaching region 53 of the surfactant rinse liquid Lsf is disposed at the center CT of the substrate W. In contrast to this, the reciprocation is performed between the two return positions set across the center CT of the substrate W. Accordingly, a relatively shorter time is required that the point of the reaching region 53 of the surfactant rinse liquid Lsf is disposed at the center CT of the substrate W. This achieves suppression in local smaller or larger line width of the resist pattern at the center CT or around the center CT of the substrate W. Here, the present invention is not limitative to the EUV lithography.

<Experimental Result>

Figure 12A:
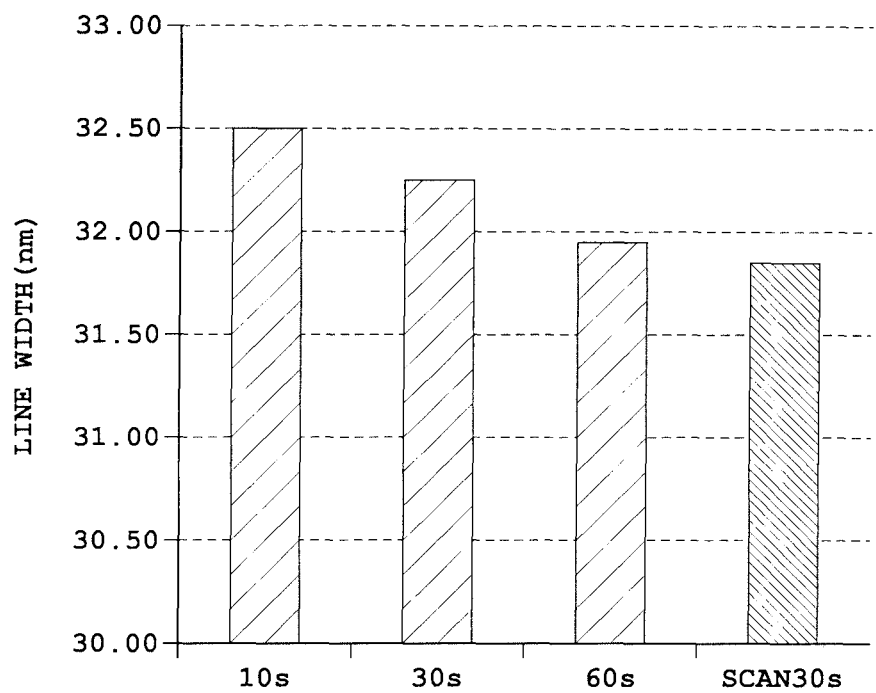
FIG. 12A illustrates an average value of line widths of a resist pattern depending on various conditions.
Figure 12B:
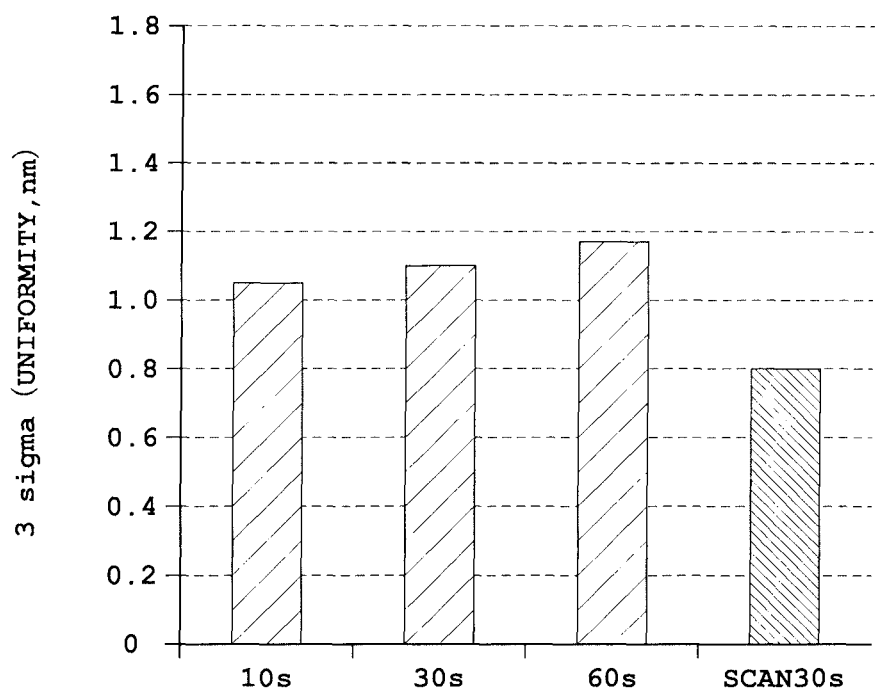
FIG. 12B illustrates 3-sigma of the line widths of the resist pattern depending on various conditions.

Now description will be made of experimental results. FIG. 12A illustrates an average value of line width (critical dimension: CD) of a resist pattern depending on various conditions. FIG. 12B illustrates 3-sigma of the line widths of the resist pattern depending on various conditions.

Figures 13, 14:
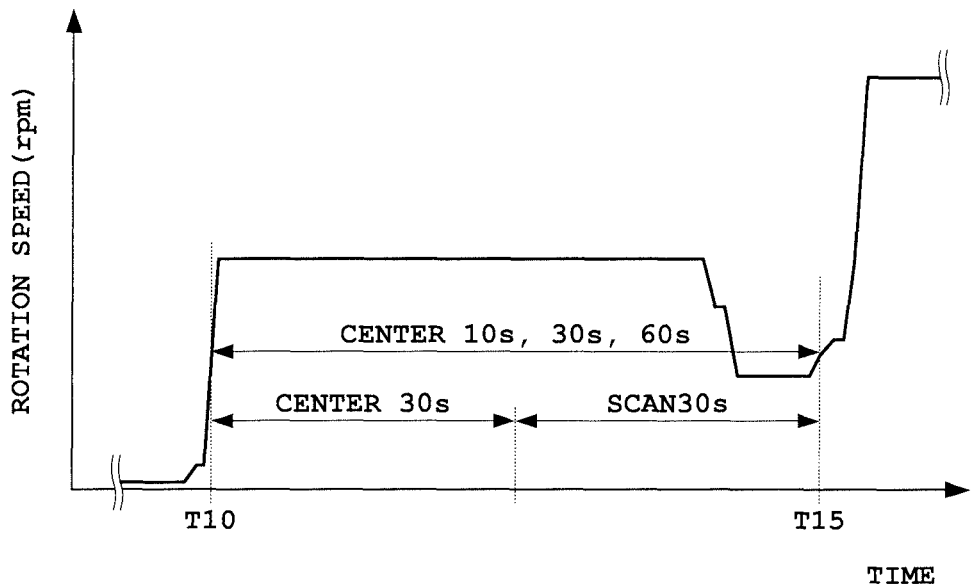
FIG. 13 illustrates experimental conditions of the rinse process in FIGS. 12A and 12B.
FIG. 14 illustrates a number of defects and a defect map when the distance of the reciprocation is varied.

FIGS. 12A and 12B illustrates results obtained by processing the substrate W through the developing step in FIG. 4, and thereafter determining line widths of the resist pattern at several tens points within the surface of the substrate W. Here, the terms "10 s", "30 s", and "60 s" mean 10 seconds, 30 seconds, and 60 seconds, respectively. As illustrated in FIG. 13, the dispensation time of the surfactant rinse liquid Lsf from the second rinse nozzle 4 is varied. Moreover, at "10 s", "30 s", and "60 s", the surfactant rinse liquid Lsf is dispensed to the center CT of the substrate W. In contrast to this, at "SCAN30 s" in FIGS. 12A and 12B, the surfactant rinse liquid Lsf is dispensed to the center CT of the substrate W for approximately 30 seconds, and thereafter, the substrate W reciprocates three times for approximately 30 seconds (by a distance of 10 mm) while the surfactant rinse liquid Lsf is dispensed.

Reference is made to FIG. 12A. The average value of the line widths of the resist pattern becomes smaller as the dispensation time becomes longer from 10 seconds to 30 seconds and 60 seconds. The result at 60 seconds is substantially equal to that at the "SCAN30 s". This is because the surfactant rinse liquid Lsf is dispensed for a total period of time of total 60 seconds at the "SCAN30 s".

Reference is made to FIG. 12B. The value of the 3-sigma (uniformity) becomes larger as the dispensation time becomes longer from 10 seconds to 30 seconds and 60 seconds. Moreover, the result of the 3-sigma at the "SCAN30 s" is smaller than that at "10 s", "30 s", and "60 s", respectively. That is, the more enhanced uniform line widths of the resist pattern over the surface of the substrate W is obtainable when the reaching point 51 of the surfactant rinse liquid Lsf is shifted from the center CT of the substrate W in comparison with the case where the surfactant rinse liquid Lsf is continuously dispensed to the center CT of the substrate W.

Moreover, FIGS. 12A and 12B illustrate the case where the dispensation of the surfactant rinse liquid Lsf starts from the center CT of the substrate W before the reaching point 51 of the surfactant rinse liquid Lsf is caused to reciprocate. In order to ensure the effect of FIGS. 12A, 12B, the second rinse nozzle 4 starts dispensing the surfactant rinse liquid Lsf to the point 51, away from the center CT of the rotating substrate W, in the embodiment of the present invention.

FIG. 14 illustrates a number of defects and a defect map when the distance of the reciprocation is varied. After the developing process is performed by feeding the developer Ldev, dispensation of the surfactant rinse liquid Lsf starts from the center CT of the rotating substrate W. Thereafter, no reciprocation is performed at "0 mm (center)". Then, reciprocation is performed by a distance of "10 mm" and "30 mm" from the center CT as a reference.

Reference is made to FIG. 14. Here, defects mean remaining dissolution product of the resist. The defects appear on the entire surface of the substrate W at "0 mm (center)", "10 mm", and "30 mm" The number of defects at "10 mm" is smaller than that at "0 mm (center)" and "30 mm" At "0 mm (center)", more defects are likely to appear especially around the center of the substrate W. At "30 mm", toroidal distribution of defects DF are made as illustrated in FIG. 7. Such a toroidal distribution of defects is considered to be made because the spread of the surfactant rinse liquid Lsf is away from the center of CT of the substrate W.

The result of FIG. 14 reveals that the toroidal distribution of defects appears in the reciprocation with a long distance from the center CT of the substrate W, leading to another drawback different from uniformity of the line widths of the resist pattern. Accordingly, it is required to cause the reaching point 51 of the surfactant rinse liquid Lsf (second rinse nozzle 4) to reciprocate within the area away from the center CT of the substrate W by the distance RD1 where no toroidal distribution of defects appears, i.e., the area where the spread of the reached surfactant rinse liquid Lsf does not move away from the center CT of the substrate W.

EMBODIMENT 2

Figure 15:
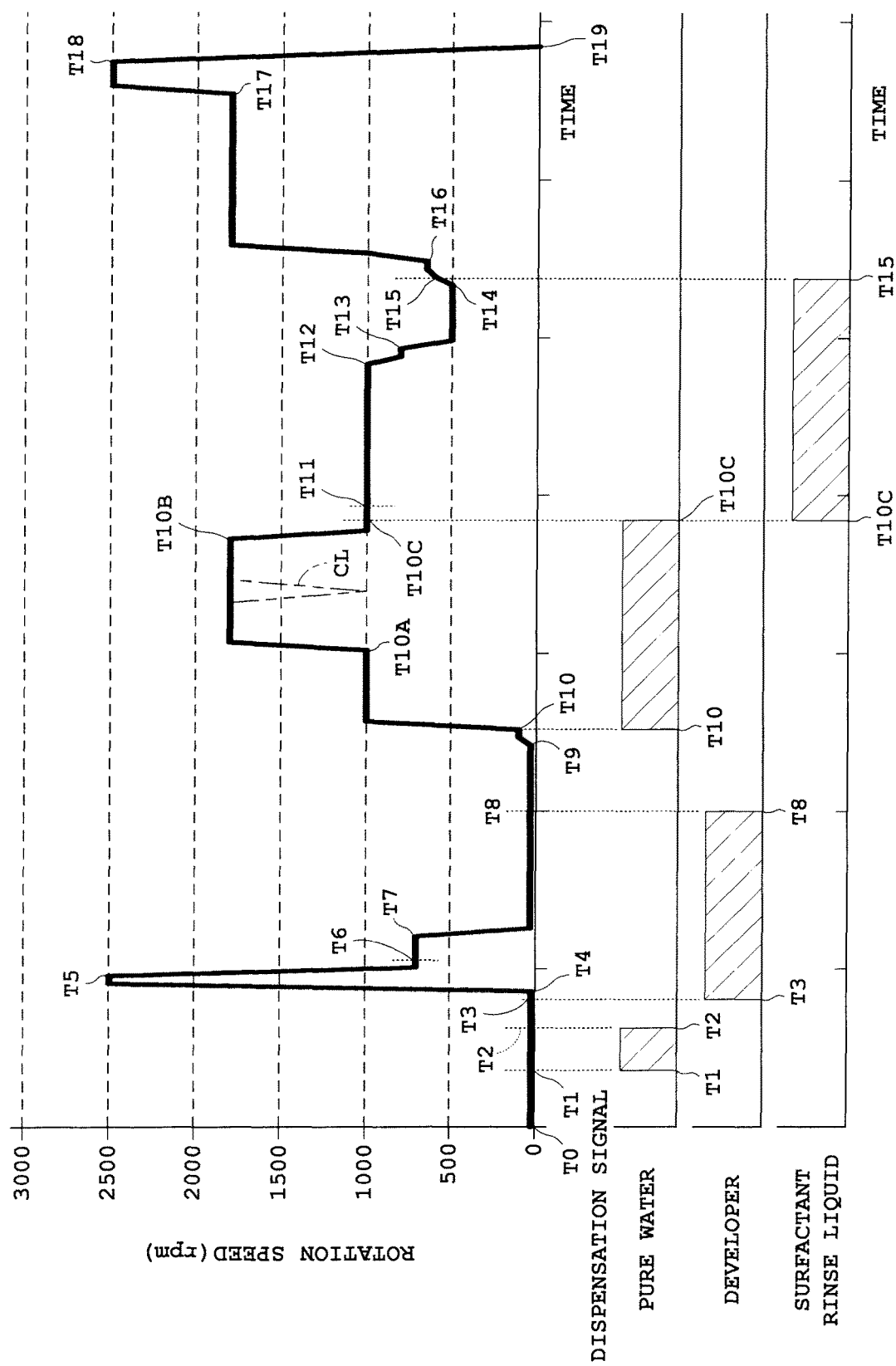
FIG. 15 schematically illustrates one example of a timing chart of a developing step according to Embodiment 2.

The following describes Embodiment 2 of the present invention with reference to drawings. Here, the description common to that of Embodiment 1 is to be omitted. FIG. 15 schematically illustrates one example of a timing chart of a developing step according to Embodiment 2.

In the rinse process in Embodiment 1, only the surfactant rinse liquid Lsf is supplied to the substrate W. In contrast to this, in a rinse process in Embodiment 2, the surfactant rinse liquid Lsf may be supplied after pure water Lpw is supplied to the substrate W.

Here, the following describes the reason why both the pure water Lpw and the surfactant rinse liquid Lsf are used. Pattern collapse of the resist pattern occurs when the substrate W is dried in the dying process rather than during the rinse process by supplying the pure water Lpw to the substrate W. In order to prevent the pattern collapse, the rinse process is performed with the surfactant rinse liquid Lsf. However, the surfactant rinse liquid Lsf is more expensive than the pure water Lpw. Accordingly, such an approach with the rinse process with the surfactant rinse liquid Lsf is adopted during the rinse process with the pure water Lpw and the drying process.

FIG. 15 illustrates one example of a timing chart of a developing step according to Embodiment 2. FIG. 15 illustrates a pre-wet process (time T0 to T3), a main developing process (time T3 to T10), and a dry process (time T16 to T19) are equal operations as in Embodiment 1, and accordingly, the description thereof is to be omitted.

In FIG. 15, after the time T8 elapses before the time T10 elapses, the rinse nozzle moving mechanism 25 in FIG. 3 causes the first rinse nozzle 3, instead of the developing nozzle 2, to move to a position around the center CT of the substrate W. That is, the rinse nozzle moving mechanism 25 causes the first rinse nozzle 3 to move to a position (see FIG. 2A) targetable to the center CT of the substrate W.

[Step S03] Rinse Process

At time T10, the holding rotator 5 increases the rotation speed of the substrate W from 100 rpm to 1000 rpm. Moreover, at the time T10, the controller 29 causes the first rinse nozzle 3 to start dispensation of the pure water Lpw to the center CT of the substrate W. Then, the holding rotator 5 rotates the substrate W at a speed of 1000 rpm (first rotation speed) until time T10A while the first rinse nozzle 3 dispenses the pure water Lpw.

At time 10A, the holding rotator 5 increases the rotation speed of the substrate W from 1000 rpm to 1800 rpm (second rotation speed). At time 10B, the holding rotator 5 decreases the rotation speed of the substrate W from 1800 rpm to 1000 rpm. That is, after the dispensation of the pure water Lpw starts, the holding rotator 5 causes the substrate W to rotate at a speed of 1800 rpm, faster than 1000 rpm, for a predetermined period of time (time T10A to T10B) while the pure water Lpw is dispensed. This allows easy discharge of scum (or dust) such as the dissolution product of the resist contained in the developer Ldev or the pure water Lpw to the outside of the substrate W.

Here, the second rotation speed (1800 rpm) is faster than the rotation speed (800 rpm or more and 1000 rpm or less) during reciprocation time of the second rinse nozzle 4 (time T11 to T12). Moreover, like a V-shaped chain double-dashed line CL between the time T10A and T10B illustrated in FIG. 15, the rotation speed may be decreased from 1800 rpm to 1000 rpm, and may be increased again from the 1000 rpm to 1800 rpm. That is, the rotation speed is increased two times from 1000 rpm to 1800 rpm. Such an operation is not limited by two times, but may be by three or more times.

After the time T10B and the rotation speed of the substrate W turns 1000 rpm, the dispensation of the pure water Lpw from the first rinse nozzle 3 is switched to the dispensation of the surfactant rinse liquid Lsf from the second rinse nozzle 4. By time T10C as a switching time, the rinse nozzle moving mechanism 25 causes the holder block 27 with the first rinse nozzle 3 and the second rinse nozzle 4 to move in a first direction. Accordingly, a reaching point 61 of the pure water Lpw dispensed from the first rinse nozzle 3 is shifted to a position away from the center CT of the substrate W by the distance RD1 (e.g., 10 mm) (see FIG. 16B). At this time, spread of the pure water Lpw contacting the substrate W is able to cover the center CT of the substrate W.

Figure 16A:
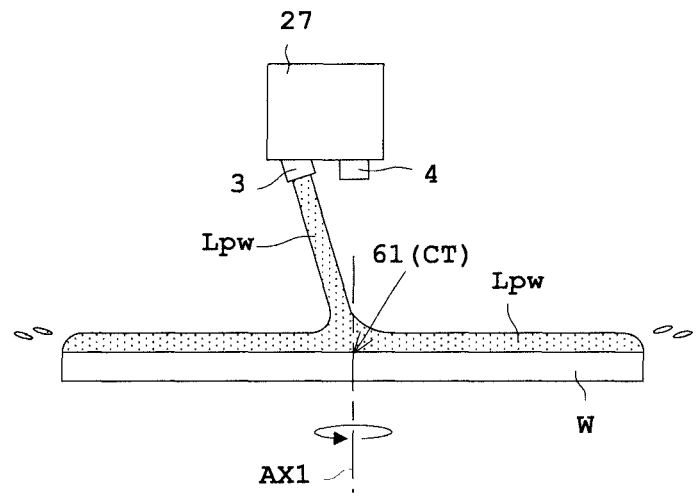
FIGS. 16A to 16C each illustrate switch between dispensation of the pure water and dispensation of the surfactant rinse liquid.
Figure 16B:
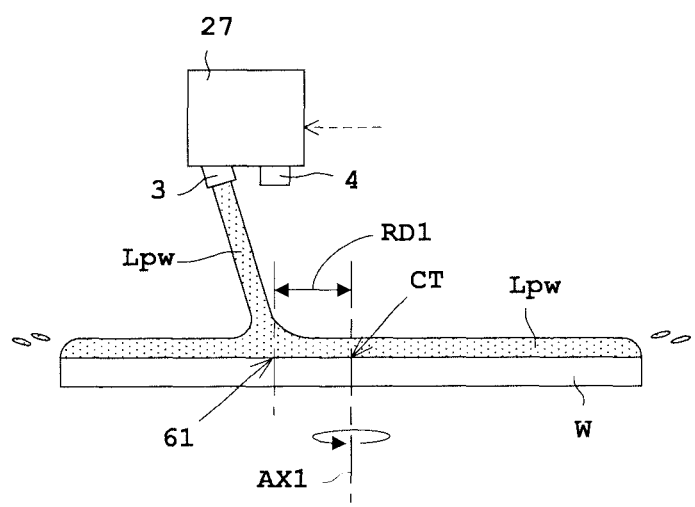
Figure 16C:
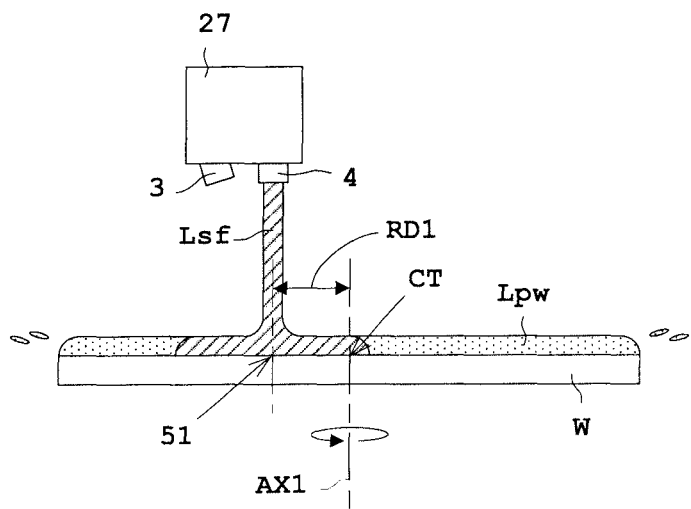

FIG. 16A illustrates dispensation of the pure water Lpw from the first rinse nozzle 3 to the center CT of the substrate W. The reaching point 61 of the pure water Lpw dispensed from the first rinse nozzle 3 substantially conforms to the center CT of the substrate W. FIG. 16B illustrates a shifted reaching point 61 of the pure water Lpw away from the center CT by the distance RD1. FIG. 16C illustrates switching the dispensation of the pure water Lpw from the first rinse nozzle 3 in FIG. 16B to the dispensation of the surfactant rinse liquid Lsf from the second rinse nozzle 4. At time T10C, the dispensation of the surfactant rinse liquid Lsf starts almost simultaneously with stop of dispensation of the pure water Lpw.

The controller 29 performs control to cover the center CT of the substrate W with the spread surfactant rinse liquid Lsf on the substrate W after the dispensation of the surfactant rinse liquid Lsf at time T10C and immediately after the surfactant rinse liquid Lsf reaches the substrate W.

At the time T11, the rinse nozzle moving mechanism 25 causes the second rinse nozzle 4 to reciprocate like the reciprocation in Embodiment 1 illustrated in FIGS. 8A, 9A, 10A, 11A. That is, the controller 29 causes the point 51 of the reaching region 53 of the surfactant rinse liquid Lsf to reciprocate within an area where the spread of the surfactant rinse liquid Lsf having reached the substrate W does not move away from the center CT of the substrate W after the center CT of the substrate W is covered with the spread of the surfactant rinse liquid Lsf Specifically, the point 51 is caused to reciprocate within a predetermined distance from the center CT (e.g., 10 mm).

The rinse process during time T12 to T16 is equal to the operation in Embodiment 1, and accordingly, the description thereof is to be omitted.

According to this embodiment, after the developing process is performed, the first rinse nozzle 3 starts dispensing the pure water Lpw to the rotating substrate W before the dispensation of the surfactant rinse liquid Lsf starts. The dispensation of the surfactant rinse liquid Lsf starts simultaneously with stop of the dispensation of the pure water Lpw. This achieves rinse process using the pure water Lpw and the surfactant rinse liquid Lsf.

Moreover, the substrate W is caused to rotate at the first rotation speed up to the second rotation speed faster than the first rotation speed for a pre-determined period of time when the pure water Lpw is dispensed after the first rinse nozzle 3 starts dispensation of the pure water Lpw and the substrate W is rotated at the first rotation speed. That is, when the rinse process is performed to the substrate W rotating at the first rotation speed with the pure water Lpw, the rotation speed of the substrate W is increased from the first rotation speed up to the second rotation speed for a predetermined period of time. This allows easy discharge of the dissolution product of the resist, for example, to the outside of the substrate W.

Figure 17A:
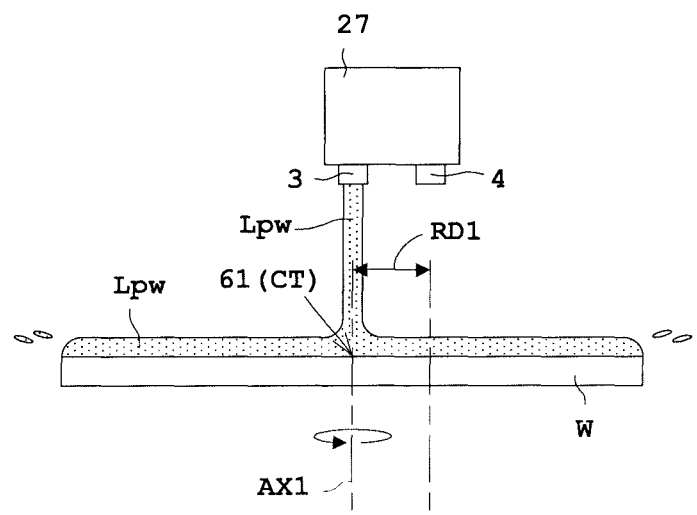
FIGS. 17A and 17B each illustrate one modification of the switch between dispensation of the pure water and dispensation of the surfactant rinse liquid.
Figure 17B:
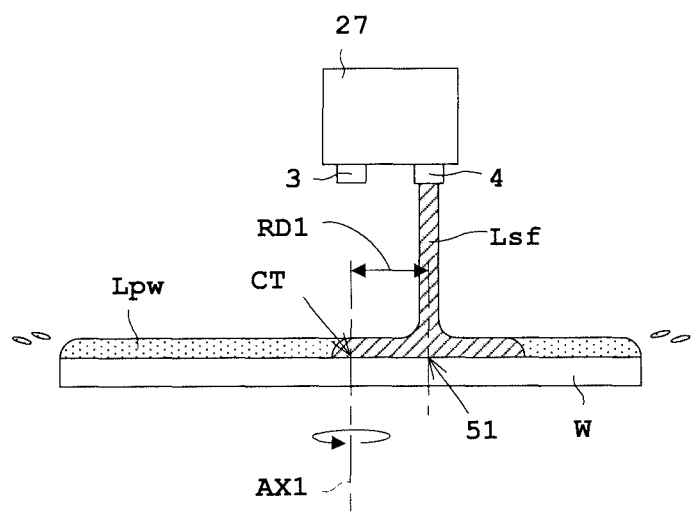

Here, the first rinse nozzle 3 illustrated in FIGS. 2A, 16A dispenses the pure water Lpw to the surface of the substrate W not vertically but obliquely. In contrast to this, as illustrated in FIGS. 17A, 17B, the first rinse nozzle 3 may dispense the pure water Lpw to the substrate W vertically. In this case, the second rinse nozzle 4 is provided on the holder block 27 at a position away from the first rinse nozzle 3 by less than the distance RD1 (e.g., 10 mm) Moreover, the second rinse nozzle 4 is provided on the holder block 27 so as to dispense the surfactant rinse liquid Lsf to a region where the reaching region 53 of the surfactant rinse liquid Lsf does not contain the center CT of the substrate W when the reaching point 61 of the pure water Lpw is present at the center CT of the substrate W.

The following describes the switching operation in this case. As illustrated in FIG. 17A, the pure water Lpw is dispensed to the center CT of the substrate W. As illustrated in FIG. 17B, the dispensation of the pure water Lpw is switched to dispensation of the surfactant rinse liquid Lsf. The reaching point 51 of the surfactant rinse liquid Lsf is away from the center CT of the substrate W by the distance RD1 without moving the holder block 27. It should be noted that combination of the approach in FIGS. 16A to 16C and the approach in FIGS. 17A, 17B is applicable.

The present invention is not limited to the foregoing examples, but may be modified as follows.

(1) In the embodiments mentioned above, the rotation speed of the substrate W for the reciprocation period of time (time T11 to T13) of the second rinse nozzle 4 in FIGS. 4 and 15 is 1000 rpm or 800 rpm. In contrast to this, as illustrated in FIG. 15 for the time T10A to T10C, the substrate W rotates at the speed of 1000 rpm (first rotation speed) after the dispensation of the surfactant rinse liquid Lsf starts. Thereafter, Moreover, the substrate W may rotate at the speed from 1000 rpm (first rotation speed) up to 1800 rpm (second rotation speed faster than the first rotation speed), for example, for a pre-determined period of time while the surfactant rinse liquid Lsf is dispensed.

The center CT and around the center CT of the substrate W may be dried when the substrate W rotates at high speeds when the second rinse nozzle 4 reciprocates. Accordingly, the controller 29 performs control to the return positions 55A, 55B, the rotation speed, and the dispensation amount such that the center CT and around the center CT of the substrate W is not dried when the second rinse nozzle 4 reciprocates. Moreover, the rotation speed may be increased from the first rotation speed up to the second rotation speed at a timing when the reaching point 51 of the surfactant rinse liquid Lsf passes the center CT of the substrate W. Increasing the rotation speed from the first rotation speed up to the second rotation speed allows easy discharge of the dissolution product of the resist, for example, to the outside of the substrate W.

(2) In the above embodiment and one modification (1), after the center CT of the substrate W is covered with the spread of the surfactant rinse liquid Lsf, the reaching point 51 of the surfactant rinse liquid Lsf dispensed from the second rinse nozzle 4 onto the substrate W is caused to reciprocate. In contrast to this, the reaching point of the surfactant rinse liquid Lsf may be fixed without being moved immediately after the surfactant rinse liquid Lsf reaches the substrate W and until the dispensation of the surfactant rinse liquid Lsf stops. That is, the second rinse nozzle 4 is fixed without being moved immediately after starting dispensation of the surfactant rinse liquid Lsf and until stopping dispensation of the surfactant rinse liquid Lsf.

Accordingly, after the developing process is performed by feeding the developer Ldev to the substrate W, the second rinse nozzle 4 starts dispensing the surfactant rinse liquid Lsf to the position away from the center CT of the rotating substrate W. Such an operation performed such that the center CT of the substrate W is not contained in the reaching region 53 of the substrate W where the surfactant rinse liquid Lsf dispensed from the second rinse nozzle 4 firstly reaches. Accordingly, the point of the reaching region of the surfactant rinse liquid is dispersed, leading to suppression in locally smaller or larger line width with line width of the resist pattern at the center CT and around the center CT of the substrate W. Consequently, this achieves enhanced uniformity of the line widths of the resist pattern within the surface of the substrate W during the rinse process.

Moreover, since the center CT of the substrate W is covered with the spread of the surfactant rinse liquid Lsf having reached the substrate W. This achieves rinse of the center CT of the substrate W with the surfactant rinse liquid Lsf even when the surfactant rinse liquid Lsf is dispensed to the point away from the center CT of the substrate W.

(3) In each of the foregoing examples and modifications, the rotation speed for a period of time T12 to time T16 is less than 1000 rpm as in FIGS. 4 and 15. However, this is not limitative. For instance, the rotation speed may be 1000 rpm for a period of time T12 to T16. In this case, at time T16, the holding rotator 5 increases the rotation speed of the substrate W from 1000 rpm to 1800 rpm.

(4) In each of the foregoing examples and modifications, the planar moving mechanism 45 in FIG. 3 causes the first rinse nozzle 3 and the second rinse nozzle 4 to move in the first direction (e.g., X direction). In contrast to this, the planar moving mechanism 45 may cause the first rinse nozzle 3 and the second rinse nozzle 4 to move in the second direction (e.g., Y direction) perpendicular to the first direction in addition to the first direction.

Moreover, in the foregoing embodiments, the second rinse nozzle 4 dispenses the surfactant rinse liquid Lsf vertically relative to the surface of the substrate W. However, this is not limitative. Alternatively, the second rinse nozzle 4 may dispense the surfactant rinse liquid Lsf obliquely relative to the surface of the substrate W as long as the reaching region 53 immediately after the dispensation is away from the center CT of the substrate W.

(5) In each of the foregoing examples and modifications, the planar moving mechanism 45 of the rinse nozzle moving mechanism 25 in FIG. 3 causes the first rinse nozzle 3 and the second rinse nozzle 4 to move in the first direction (e.g., X direction). Instead of such a configuration as above, the rinse nozzle moving mechanism 25 may cause the first rinse nozzle 3 and the second rinse nozzle 4 to rotate (move) around the rotation shaft provided outside of the substrate W in FIG. 3. Moreover, the rinse nozzle moving mechanism 25 may include an articulated aim. In these cases, the rinse nozzle moving mechanism 25 includes an electric motor.

Moreover, the developing nozzle 2, the first rinse nozzle 3, and the second rinse nozzle 4 may move individually. Moreover, the developing nozzle 2 may move integrally with at least either the first rinse nozzle 3 or the second rinse nozzle 4.

(6) In each of the foregoing examples and modifications, the developer Ldev or the pure water Lpw is dispensed to the center CT of the substrate W in the pre-wet process, the developing process, and the dispensing process of the pure water Lpw for a period of time T10 to T10C in FIG. 15. Alternatively, the first rinse nozzle 3 may start dispensing the pure water Lpw to the point, away from the center CT of the rotating substrate W. Such an operation performed such that the center CT of the substrate W is not contained in the reaching region of the substrate W where the pure water Lpw dispensed from the first rinse nozzle 3 firstly reaches. Moreover, the center CT of the substrate W may be covered with the spread of the pure water Lpw on the substrate W immediately after the pure water Lpw reaches the substrate W. This is similarly applicable to the developer Ldev.

(7) In each of the foregoing embodiments and the modifications, the reaching point 51 of the surfactant rinse liquid Lsf is moved as under. That is, at time T10 in FIG. 4, for example, the surfactant rinse liquid Lsf is dispensed to the reaching point 51 away from the center CT of the substrate W (e.g., a point away from the center CT by 10 mm). At time T11, the reaching point 51 reciprocates one time or a plurality of times within the area (e.g., within the area away from the center CT by 10 mm) where the spread of the surfactant rinse liquid Lsf on the substrate W does not move away from the center CT of the substrate W. Thereafter, the reaching point 51 is, returned to an initial reaching point (e.g., the point away from the center CT by 10 mm).

In other words, the reciprocation of the reaching point 51 is determined in accordance with the number of reciprocation time. However, this is not limitative. For instance, the reciprocation of the reaching point 51 is determinable in accordance with a period of time. That is, as in FIG. 4 for example, the reaching point 51 (second rinse nozzle 4) may continuously move after the reciprocation starts at time T11 until the dispensation of the surfactant rinse liquid Lsf stops at time T15.

The present invention may be embodied in other specific forms without departing from the spirit or essential attributes thereof and, accordingly, reference should be made to the appended claims, rather than to the foregoing specification, as indicating the scope of the invention.

What is claimed is:

1. A developing method for performing development to a substrate, the developing method comprising:
   a developing step of performing a developing process to a substrate rotating around the center thereof by feeding developer to the substrate;
   a dispensation starting step of starting dispensation of a surfactant rinse liquid from a surfactant rinse nozzle to a position, away from the center of the substrate on the rotating substrate, after the developing step such that the center of the substrate does not enter into a reaching region of the substrate where the surfactant rinse liquid dispensed from the surfactant rinse nozzle firstly reaches;
   a covering step of covering the center of the substrate with spread of the surfactant rinse liquid having reached the substrate immediately after the surfactant rinse liquid reaches the substrate; and
   a fixing step of fixing a point of the reaching region of the surfactant rinse liquid from immediately after the surfactant rinse liquid reaches the substrate until the dispensation of the surfactant rinse liquid stops.

2. The developing method according to claim 1, further comprising:
   a pure water dispensation starting step of starting dispensation of pure water from a pure water rinse nozzle onto the rotating substrate after the developing step before the dispensation starting step with the surfactant rinse liquid, wherein
   the dispensation starting step with the surfactant rinse liquid is performed simultaneously with stopping the dispensation of the pure water.

3. The developing method according to claim 2, further comprising:
   a rotating step of rotating the substrate at a first rotation speed while the dispensation of the pure water starts from the pure water rinse nozzle, and thereafter rotating the substrate at a second rotation speed, faster than the first rotation speed, for a pre-determined period of time while the pure water is dispensed.

4. The developing method according to claim 3, wherein the first rotation speed and the second rotation speed fall within a range of 500 rpm or more to 2000 rpm or less.

5. The developing method according to claim 1, further comprising:
   a rotating step of rotating the substrate at a speed in a range of 500 rpm or more to 2000 rpm or less after the dispensation of the surfactant rinse liquid from the surfactant rinse nozzle starts until the dispensation of the surfactant rinse liquid stops.

6. A developing method for performing development to a substrate, the developing method comprising:
   a developing step of performing a developing process to a substrate rotating around the center thereof by feeding developer to the substrate;
   a dispensation starting step of starting dispensation of a surfactant rinse liquid from a surfactant rinse nozzle to a position, away from the center of the substrate on the rotating substrate, after the developing step such that the center of the substrate does not enter into a reaching region of the substrate where the surfactant rinse liquid dispensed from the surfactant rinse nozzle firstly reaches;
   a covering step of covering the center of the substrate with spread of the surfactant rinse liquid having reached the substrate immediately after the surfactant rinse liquid reaches the substrate; and
   a shifting step of shifting the reaching region of the surfactant rinse liquid within an area such that the spread of the surfactant rinse liquid having reached the substrate is not away from the center of the substrate after the spread of the surfactant rinse liquid covers the center of the substrate.

7. The developing method according to claim 6, wherein the shifting step of shifting the reaching region includes causing the reaching region to reciprocate along a route containing the center of the substrate, the route being set to have two return positions across the center of the substrate.

* * * * *